(12) United States Patent
Jung et al.

(10) Patent No.: US 9,190,139 B2
(45) Date of Patent: Nov. 17, 2015

(54) MEMORY AND MEMORY SYSTEM INCLUDING THE SAME

(71) Applicant: SK hynix Inc., Gyeonggi-do (KR)

(72) Inventors: Chul-Moon Jung, Gyeonggi-do (KR); Bo-Yeun Kim, Gyeonggi-do (KR); Saeng-Hwan Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/296,020

(22) Filed: Jun. 4, 2014

(65) Prior Publication Data

US 2015/0170728 A1    Jun. 18, 2015

(30) Foreign Application Priority Data

Dec. 18, 2013   (KR) .................. 10-2013-0158327

(51) Int. Cl.
*G11C 8/08* (2006.01)
*G11C 11/408* (2006.01)
*G11C 11/406* (2006.01)
*G11C 29/00* (2006.01)

(52) U.S. Cl.
CPC .............. *G11C 11/4087* (2013.01); *G11C 8/08* (2013.01); *G11C 11/40611* (2013.01); *G11C 29/783* (2013.01)

(58) Field of Classification Search
CPC ................................ G11C 11/406; G11C 8/08
USPC .............................................. 365/222, 230.06
See application file for complete search history.

(56) References Cited

U.S. PATENT DOCUMENTS

| | | | |
|---|---|---|---|
| 7,388,799 B2 * | 6/2008 | An ................................ | 365/222 |
| 2006/0098504 A1 * | 5/2006 | Takita .......................... | 365/200 |
| 2007/0002656 A1 * | 1/2007 | An ................................ | 365/222 |
| 2009/0161457 A1 | 6/2009 | Wakimoto | |
| 2012/0218843 A1 * | 8/2012 | Yun et al. ..................... | 365/194 |

FOREIGN PATENT DOCUMENTS

KR        1020150002112         1/2015

* cited by examiner

*Primary Examiner* — Michael Tran
(74) *Attorney, Agent, or Firm* — IP & T Group LLP

(57) ABSTRACT

A memory may include a plurality of word lines, one or more redundancy word lines for replacing one or more word lines among the plurality of word lines, a target address generation unit suitable for generating one or more target addresses using a stored address, and a control unit suitable for sequentially refreshing the plurality of word lines in response to a refresh command which is periodically inputted, refreshing a word line selected based on the target address when the refresh command is inputted M times, and refreshing the one or more redundancy word lines whenever the refresh command is inputted N times, wherein the M and N are natural numbers.

24 Claims, 10 Drawing Sheets

MEMORY AND MEMORY SYSTEM INCLUDING THE SAME

CROSS-REFERENCE TO RELATED APPLICATIONS

The present application claims priority of Korean Patent Application No. 10-2013-0158327, filed on Dec. 18, 2013, which is incorporated herein by reference in its entirety.

BACKGROUND

1. Field

Exemplary embodiments of the present invention relate to a memory and a memory system including the same.

2. Description of the Related Art

A memory cell of a memory includes a transistor serving as a switch and a capacitor serving to store a charge (data). Depending on whether a charge is stored in the capacitor of the memory cell, that is, whether a terminal voltage of the capacitor is high or low, the data may be divided into logic high (logic 1) and logic low (logic 0) data.

Data is stored in such a manner that charge is accumulated in a capacitor. Thus, no power is consumed in maintaining stored data in theory. However, since current leakage occurs at the PN junction of MOS transistors, the initial charge stored in the capacitor may be lost, resulting in the corresponding data being lost. To prevent data loss, data of the memory cell is read and the charge is stored again based on the read information, before the data is lost. This process, called a refresh operation, is periodically performed to maintain the data.

FIG. 1 is a diagram illustrating part of a cell array included in a memory that will be used to explain word line disturbance. In FIG. 1, 'BL' represents a bit line.

In FIG. 1, 'WLK−1', 'WLK', and 'WLK+1' in the cell array represent three word lines arranged in parallel. Furthermore, word line WLK with 'HIGH_ACT' represents a word line with high activity, and word lines WLK−1 and WLK+1 represent word lines arranged adjacent to the word line WLK. Furthermore, 'CELL_K−1', 'CELL_K', and 'CELL_K+1' represent memory cells coupled to the word lines WLK−1, WLK, and WLK+1, respectively. The memory cells CELL_K−1, CELL_K and CELL_K+1 include cell transistors TR_K−1, TR_R, and TR_K+1 and cell capacitors CAP_K−1, CAP_K, and CAP_K+1, respectively.

In FIG. 1, when the word line WLK is activated and pre-charged (deactivated), the voltages of the word lines WLK−1 and WLK+1 are increased and decreased by a coupling effect between the word line WLK and the word lines WLK−1 and WLK+1, thereby influencing charges stored in the cell capacitors CAP_K−1 and CAP_K+1. Thus, when the word line WLK is frequently activated-precharged to toggle between the active state and the precharge state, the data stored in the memory cells CELL_K−1 and CELL_K+1 may be lost by the change in charge stored in the capacitors CAP_K−1 and CAP_K+1.

Furthermore, electronic waves, generated while a word line toggles between the active state and the precharge state, may introduce/discharge electrons into/from a cell capacitor included in a memory cell coupled to an adjacent word line, potentially losing the data of the memory cell.

SUMMARY

Various embodiments of the present invention are directed to a memory and a memory system which are capable of refreshing word lines adjacent to a highly active word line, thereby preventing loss of data stored in memory cells coupled to the adjacent word lines.

Also, various embodiments of the present invention are directed to a memory and a memory system which are capable of preventing the loss of data stored in memory cells coupled to a redundancy word line.

In an embodiment, a memory may include a plurality of word lines, one or more redundancy word lines suitable for replacing one or more word lines among the plurality of word lines, a target address generation unit suitable for generating one or more target addresses using a stored address, and a control unit suitable for sequentially refreshing the plurality of word lines in response to a refresh command which is periodically inputted, refreshing a word line selected based on the target address when the refresh command is inputted M times, and refreshing the one or more redundancy word lines whenever the refresh command is inputted N times, wherein the M and N are natural numbers.

The memory may further include an address detection unit suitable for detecting an address of a word line, which is activated a set number of times or more or is activated with a set frequency or higher, among the plurality of word lines.

The memory may further include a first counting unit suitable for generating first counting information which is changed whenever a word line is refreshed, and a second counting unit suitable for generating second counting information which is changed whenever a redundancy word line is refreshed.

The control unit may include a refresh control unit suitable for enabling a first refresh signal in response to the refresh command, enabling a second refresh signal when the refresh command is inputted M times, and enabling a third refresh signal when the refresh command is inputted N times, and a row control unit suitable for refreshing the word line selected based on the first counting information in response to the first refresh signal, refreshing the word line selected based on the target address in response to the second refresh signal, and refreshing the redundancy word line selected based on the second counting information in response to the third refresh signal.

The control unit may further include a redundancy control unit suitable for storing a fault address, and enabling a redundancy signal and outputting redundancy information corresponding to one of the one or more redundancy word lines when the first counting information is equal to the fault address.

The row control unit may include an address selection unit suitable for selecting the first counting information in response to the first refresh signal, and selecting the target address in response to the second refresh signal; and a word line control unit suitable for refreshing a word line corresponding to an output of the address selection unit when the first refresh signal or the second refresh signal is enabled, refreshing a redundancy word line corresponding to the redundancy information when the redundancy signal is enabled, and refreshing a redundancy word line corresponding to the second counting information when the third refresh signal is enabled.

The control unit may include a redundancy control unit suitable for storing fault addresses, enabling a redundancy signal and outputting redundancy information corresponding to one of the redundancy word lines when the first counting information is equal to one of the stored fault addresses, and enabling a target redundancy enable signal when the number of the stored fault addresses is a set number or more; a refresh control unit suitable for enabling a first refresh signal in response to the refresh command, enabling a second refresh signal when the refresh command is inputted M times, and enabling a third refresh signal in response to the target redundancy enable signal when the refresh command is inputted N times; and a row control unit suitable for refreshing the word line selected based on the first counting information in response to the first refresh signal, refreshing the word line selected based on the target address in response to the second refresh signal, and refreshing the redundancy word line selected based on the second counting information in response to the third refresh signal.

In an embodiment, a memory system may include a memory including a plurality of word lines and one or more redundancy word lines for replacing one or more word lines among the plurality of word lines, and suitable for sequentially refreshing the plurality of word lines in response to a refresh command which is periodically inputted, refreshing a word line selected based on a target address whenever the refresh command is inputted M times, and refreshing the one or more redundancy word lines whenever the refresh command is inputted N times, wherein the N and M are natural numbers, and a memory controller suitable for periodically inputting the refresh command to the memory.

The memory may include an address detection unit suitable for detecting an address of a word line among the plurality of word lines, which is activated a set number of times or more or is activated with a set frequency or more.

In an embodiment, a memory may include a plurality of word lines; one or more word lines suitable for replacing one or more redundancy word lines among the plurality of word lines; and a control unit suitable for sequentially refreshing the plurality of word lines in response to a refresh command which is periodically inputted, and sequentially refreshing the one or more redundancy word lines whenever the refresh command is inputted N times, wherein the N is a natural number.

The memory may further include a first counting unit suitable for generating first counting information which is changed whenever a word line is refreshed, and a second counting unit suitable for generating second counting information which is changed whenever a redundancy word line is refreshed.

The control unit may include a redundancy control unit suitable for enabling a redundancy signal when the first counting information is equal to a fault address; a refresh control unit suitable for enabling a refresh signal in response to the refresh command, and enabling a redundancy refresh signal when the refresh command is inputted N times; and a row control unit suitable for refreshing a word line selected based on the first counting information in response to the refresh signal, and refreshing a redundancy word line selected based on the second counting information in response to the redundancy refresh signal.

In an embodiment, a memory may include a plurality of word lines; one or more redundancy word lines suitable for replacing one or more word lines among the plurality of word lines; a counting unit suitable for generating first counting information which is changed whenever a word line is refreshed, and generating second counting information which is changed whenever a redundancy word line is changed; a target address generation unit suitable for detecting an address of a word line, which is activated a set number of times or more or is activated with a set frequency or higher, among the plurality of word lines, and generating a target address corresponding to one or more word lines adjacent to a detected word line corresponding to a detected address detected by the address detection unit; and a control unit suitable for refreshing a word line selected based on the first counting information in response to a refresh command, refreshing a word line selected based on the target address whenever the refresh command is inputted M times, and refreshing a redundancy word line selected based on the second counting information whenever the refresh command is inputted N times, wherein the M and N are natural numbers.

The control unit may include a refresh control unit suitable for enabling a first refresh signal in response to the refresh command, enabling a second refresh signal when the refresh command is inputted M times, and enabling a third refresh signal when the refresh command is inputted N times; and a row control unit suitable for refreshing the word line selected based on the first counting information in response to the first refresh signal, refreshing the word line selected based on the target address in response to the second refresh signal, and refreshing the redundancy word line selected based on the second counting information in response to the third refresh signal.

DETAILED DESCRIPTION

Figure 1:
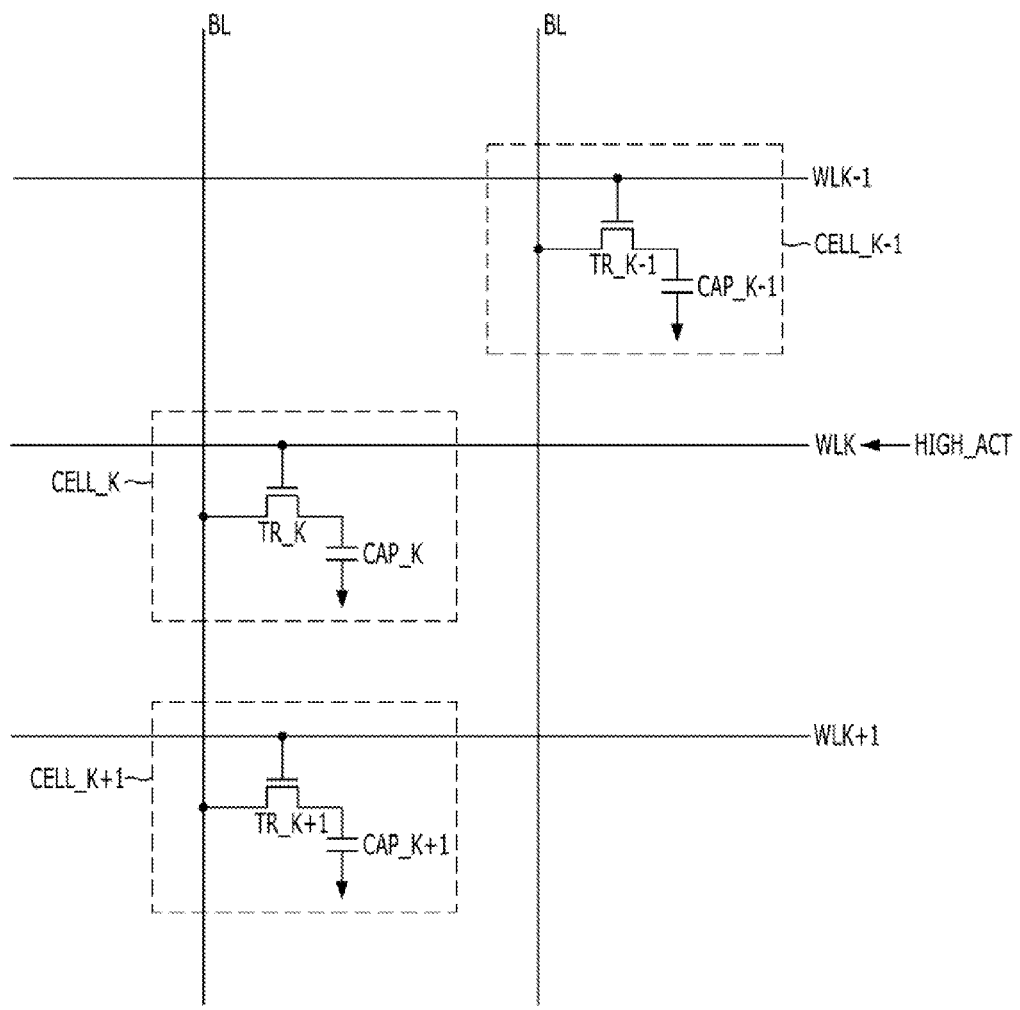
FIG. 1 is a diagram illustrating a part of a cell array included in a memory, in order to explain word line disturbance.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

In this specification, a highly active word line may indicate a word line which satisfies one or more of the following conditions: an active number (that is, the number of times the word line is activated) that is greater than or equal to a reference number; and an active frequency (that is, the frequency with which the word line is activated) that is greater than or equal to a reference frequency during a preset period. Hereafter, a normal refresh operation may indicate an operation in which a memory sequentially refreshes a number of word lines, a target refresh operation may indicate an operation in which the memory refreshes one or more word lines adjacent to a highly active word line, and a redundancy refresh operation may indicate an operation in which the memory directly selects and refreshes a redundancy word line regardless of a redundancy operation for replacing a word line.

Figure 2:
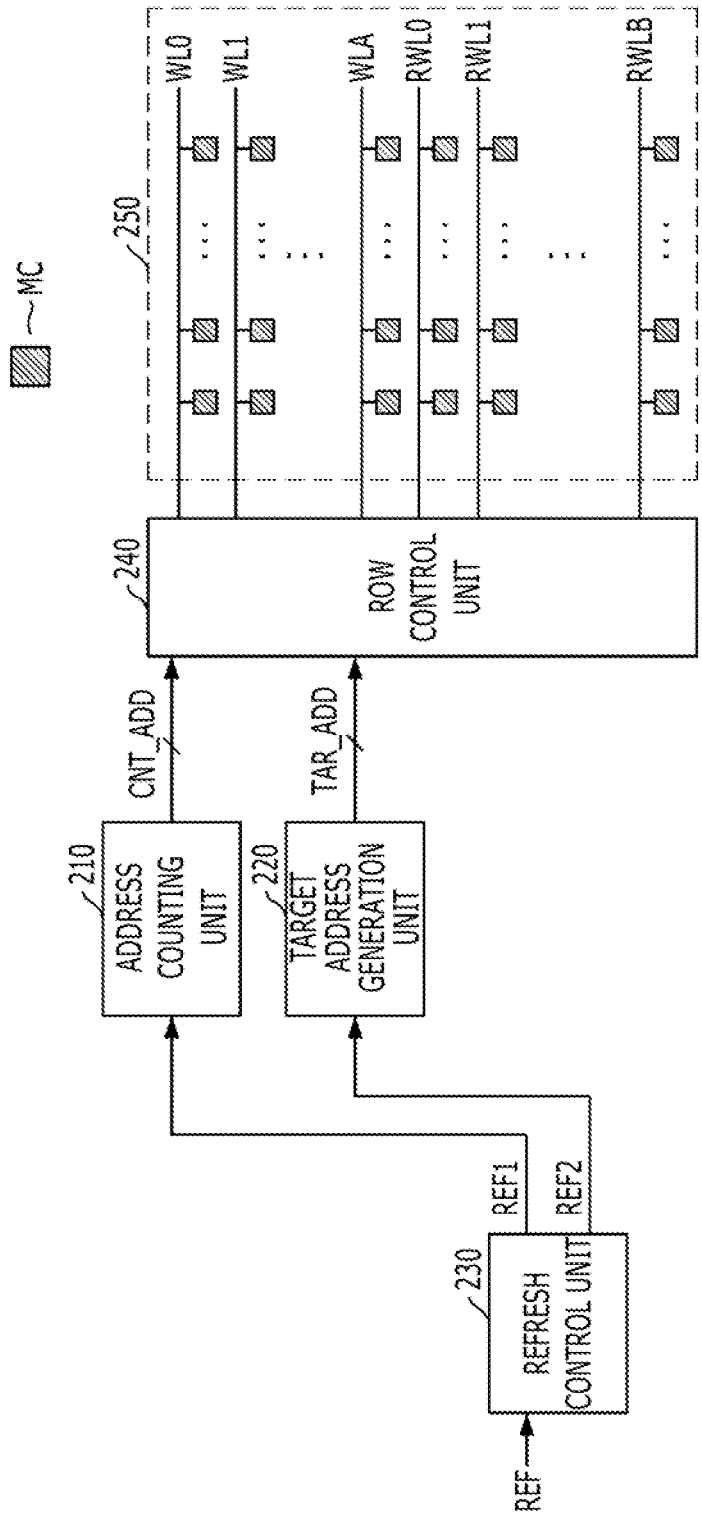
FIG. 2 is a diagram illustrating a part of a memory, in order to explain a target refresh operation.

FIG. 2 is a diagram illustrating a part of a memory in order to explain a target refresh operation.

As illustrated in FIG. 2, the memory may include an address counting unit 210, a target address generation unit 220, a refresh control unit 230, a row control unit 240, and a cell array 250.

The cell array 250 may include a plurality of word lines WL0 to WLA coupled to one or more memory cells MC and a plurality of redundancy word lines RWL0 to RWLB for replacing word lines having a fault in the operation among the plurality of word lines WL0 to WLA.

The refresh control unit 230 may enable a first refresh signal REF1 one or more times when a refresh command REF is inputted, and enable a second refresh signal REF2 whenever the refresh command REF is inputted a set number of times. For example, the refresh control unit 230 may enable the first refresh signal REF1 when the refresh command REF is inputted, count how many times the refresh command REF is inputted, and enable the second refresh command REF whenever the refresh command REF is inputted four times.

The address counting unit 210 may generate a counting address CNT_ADD, and change the value of the counting address CNT_ADD whenever the first refresh signal REF1 is enabled. The address counting unit 210 may increase the value of the counting address CNT_ADD by one whenever the first refresh signal REF1 is enabled. In order to increase the value of the address CNT_ADD by one the address counting unit 210 may change the address CNT_ADD such that a (K+1)-th word line WLK+1 is selected in a case where a K-th word line WLK was previously selected.

The target address generation unit 220 may detect a highly active word line by referring to information on word lines activated in the memory during a set period, and store the address of the highly active word line. The target address generation unit 220 may generate a target address TAR_ADD corresponding to a word line adjacent to the highly active word line using the stored address. The target address generation unit 220 may output the target address TAR_ADD when the second refresh signal REF2 is enabled. The target address TAR_ADD may have a value obtained by adding or subtracting one to or from the address of the highly active word line.

The row control unit 240 may refresh a word line corresponding to the counting address CNT_ADD when the first refresh signal REF1 is enabled, and refresh a word line corresponding to the target address TAR_ADD when the second refresh signal REF2 is enabled.

The memory may refresh the word line corresponding to the counting address CNT_ADD in response to the first refresh signal REF1 when the refresh command REF is inputted. Since the value of the counting address CNT_ADD sequentially increases, a plurality of word lines WL0 to WLM included in the memory may be sequentially refreshed (normal refresh). The memory may refresh the word line corresponding to the target address TAR_ADD in response to the second refresh signal REF2 when the refresh command REF is inputted a set number of times (target refresh). At this time, the word line corresponding to the target address TAR_ADD may include one or more adjacent word lines.

The plurality of word lines WL0 to WLA has allocated addresses. When a highly active word line is one of the word lines WL0 to WLA, the memory may perform a target refresh operation on word lines adjacent to the highly active word line, using the addresses. However, the plurality of redundancy word lines RWL0 to RWLB has allocated addresses. Thus, when a highly active word line is one of the redundancy word lines RWL0 to RWLB, it is difficult to perform a target refresh operation on redundancy word lines adjacent to the redundancy word line corresponding to the highly active word line.

Figure 3:
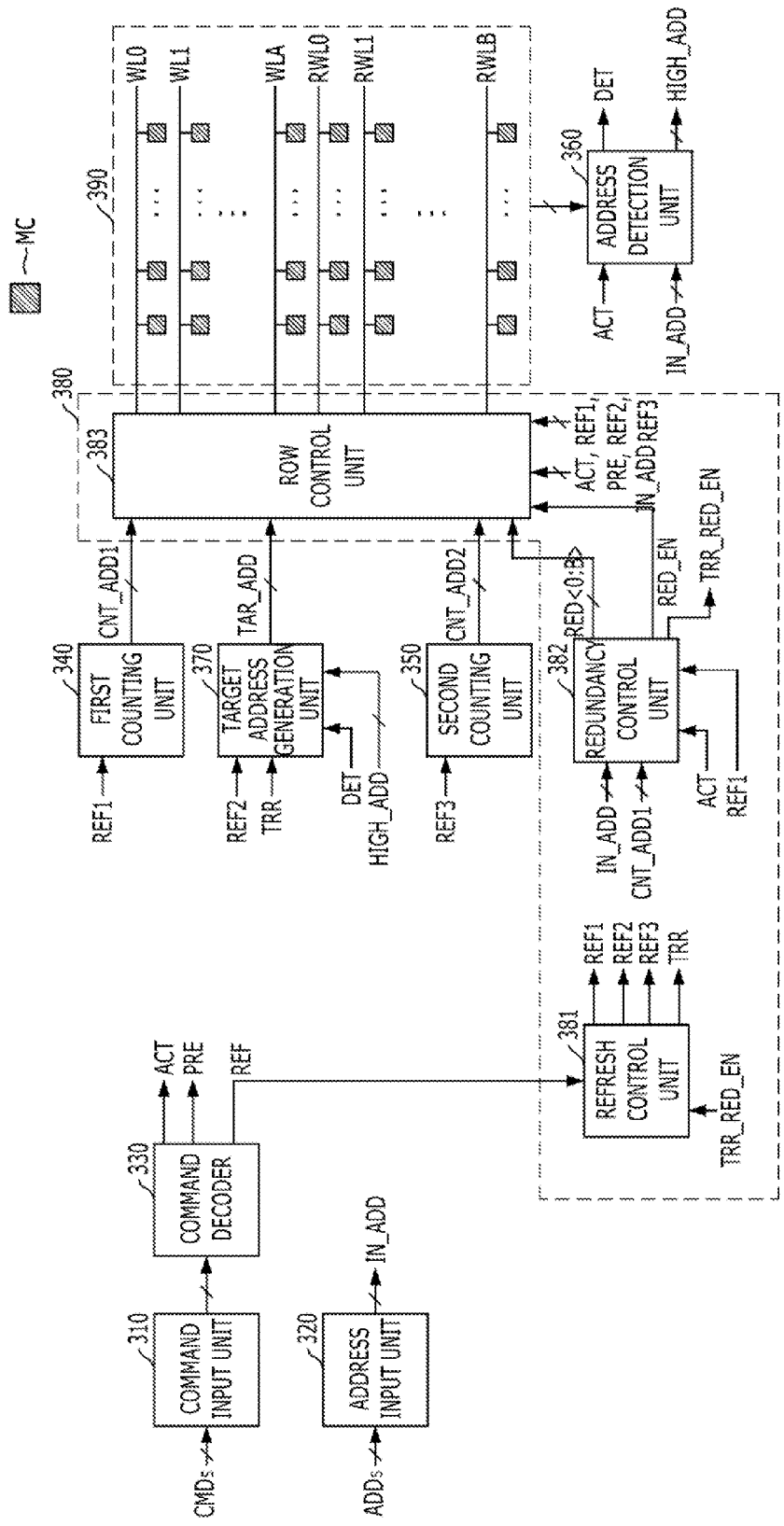
FIG. 3 is a configuration of a memory in accordance with an embodiment of the present invention.

FIG. 3 is a configuration of a memory in accordance with an embodiment of the present invention.

As Illustrated in FIG. 3, the memory may include a command input unit 310, an address input unit 320, a command decoder 330, a first counting unit 340, a second counting unit 350, an address detection unit 360, a target address generation unit 370, a control unit 380, and a cell array 390. FIG. 3 illustrates only components related to an active operation and a refresh operation in the memory and does not illustrate components related to operations such as read and write operations, which have no direct relation with the present invention.

Referring to FIG. 3, the memory will be described.

The cell array 390 may include a plurality of word lines WL0 to WLA and a plurality of redundancy word lines RWL0 to RWLB where A and B are a natural number. Each of the word lines WL0 to WLA and the redundancy word lines RWL0 to RWLB may be coupled to one or more memory cells MC. The plurality of word lines WL0 to WLA may be arranged in order of 'WL0' to 'WLA' and the plurality of redundancy word lines RWL0 to RWLB may be arranged in order of 'RWL0' to 'RWLB' after the word line WLA.

The command input unit 310 may receive commands CMDs and the address input unit 320 may receive addresses ADDs. Each of the commands CMDs and the addresses ADDs may include multi-bit signals.

The command decoder 330 may decode the command signals CMDs inputted through the command input unit 310, and generate an active command ACT, a refresh command REF, and a precharge command PRE. The command decoder 330 may enable the active command ACT when a combination of the input command signals CMDs indicates the active command ACT, may enable the refresh command REF when the combination of the input command signals CMDs indicates the refresh command REF, and may enable the precharge command PRE when the combination of the input command signals CMDs indicates the precharge command PRE. In addition, the command decoder 330 may also generate read and write commands by decoding the input command signals CMDs. Since the read and write commands have no direct relation with the memory, the detailed illustrations and descriptions thereof have been omitted.

The first counting unit 340 may generate first counting information CNT_ADD1 where the value is changed whenever the word lines WL0 to WLA are refreshed. The first counting unit 340 may increase the value of the first counting information CNT_ADD1 by one whenever the first refresh signal REF1_ACT is enabled. The first counting information CNT_ADD1 may be used as an address for selecting a word line on which a refresh operation is to be performed during a normal refresh operation. When the value of the counting information CNT_ADD1 is increased by one, it may indicate that the counting information CNT_ADD1 is changed to select a (K+1)-th word line WLK+1 in a case where a K-th word line WLK was selected previously.

The second counting unit 350 may generate second counting information CNT_ADD2 of which the value is changed whenever the redundancy word lines RWL0 to RWLB are refreshed. The second counting unit 350 may increase the value of the second counting information CNT_ADD2 by one whenever a third refresh signal REF3 is enabled. The second counting information CNT_ADD2 may be used as information for selecting a redundancy word line on which a refresh operation is to be performed during a redundancy refresh operation. When the value of the counting information CNT_ADD2 is increased by one, it may indicate that the counting information CNT_ADD2 is changed to select a (K+1)-th redundancy word line RWLK+1 in case where a K-th redundancy word line RWLK was selected just before.

When a highly active word line or highly active address is detected, the address detection unit 360 may enable a detection signal DET, and output an address HIGH_ADD of the highly active word line. The address detection unit 360 may detect a word line, which satisfies one or more of the following conditions, as a highly active word line among the plurality of word lines WL0 to WLA: an active number is greater than or equal to a reference number; and an active frequency is greater than or equal to a reference frequency.

The address detection unit 360 may receive an active command ACT and an input address IN_ADD, count how many times each word line is activated during a set period, compare the active number of each word line to the reference number, and detect a word line which is activated the reference number of times or more during the set period. Furthermore, the address detection unit 360 may store the history of each word line activated during a set period, compare the active frequency of each word line to the reference frequency, and detect a word line which is activated at the reference frequency or more during the set period. The history of each word line may include information indicating which word lines have been activated during the set period. The address detection unit 360 may determine a word line, which is detected through one or more of the above-described methods, as a highly active word line. For reference, the reference number and the reference frequency may be set in consideration of how the memory cell MC can endure word line disturbance.

For example, the address detection unit 360 may set the reference number to 10^5 and detect a word line having an active number greater than or equal to 10^5 during the set period. Alternatively, the address detection unit 360 may set the reference frequency to a frequency of activation twice per five active operations, and detect a word line which is activated two or more times per five active operations during the set period. For reference, the set period may be set to correspond to a specific time using a timer, or set to correspond to a period during which the active command ACT or refresh command REF is inputted a set number of times.

The target address generation unit 370 may store the address HIGH_ADD of the highly active address (hereafter, referred to as a highly active address), outputted through the address detection unit 360, when the detection signal DET is enabled, and generate a target address TAR_ADD when the target refresh signal TRR is enabled. The target address TAR_ADD may include an address or addresses of one or more word lines adjacent to the highly active word line. The target address generation unit 370 may generate the target address TAR_ADD by adding or subtracting one to or from the value of the stored highly active address HIGH_ADD when the target refresh signal TRR is enabled, and output the target address TAR_ADD when the second refresh signal REF2 is enabled. When the highly active word line is a K-th word line WLK, the value obtained by subtracting one from the highly active address HIGH_ADD may correspond to a (K−1)-th word line WLK−1, and the value obtained by adding one to the highly active address HIGH_ADD may correspond to a (K+1)-th word line WLK+1.

The control unit 380 may refresh a word line selected through the first counting information CNT_ADD1 in response to the refresh command REF which is periodically inputted. When the refresh command REF is inputted M times, the control unit 380 may refresh a word line selected through the target address TAR_ADD, and when the refresh command REF is inputted N times, the control unit 380 may refresh a redundancy word line selected through the second counting information CNT_ADD2. Since the first counting information CNT_ADD1 sequentially increases in response to the first refresh signal REF1, the control unit 380 may sequentially refresh the plurality of word lines WL0 to WLA in response to the first counting information CNT_ADD1. Furthermore, since the second counting information CNT_ADD2 sequentially increases in response to the third refresh signal REF3, the control unit 380 may sequentially refresh the plurality of redundancy word lines RWL0 to RWLB in response to the second counting information CNT_ADD2.

The control unit 380 may include a refresh control unit 381, a redundancy control unit 382, and a row control unit 383. The refresh control unit 381 may enable the first refresh signal REF1 in response to the refresh command REF, enable the second refresh signal REF2 when the refresh command REF is inputted M times, and enable the third refresh signal REF3 when the refresh command REF is inputted N times. The refresh control unit 381 may enable the target refresh signal TRR during a set period, when the refresh command REF is inputted M times. The target refresh signal TRR may be enabled during a time required for refreshing one or more adjacent word lines. The refresh control unit 381 may count the refresh command REF. The refresh control unit 381 may enable the second refresh signal REF1 when the refresh command REF is counted M times, and enable the third refresh signal REF3 when the refresh command REF is counted N times. The counting of the refresh command REF may be started when the input of the refresh command REF is started or after the refresh command REF is inputted a set number of times.

In the present embodiment, M and N may have the same value or different values. When M=4 and N=5, that is, when M and N have different values, the refresh control unit 381 may enable the second refresh signal REF2 when the refresh command REF is inputted four times, and enable the third refresh signal REF3 when the refresh command REF is inputted five times. When enabling the second or third refresh signal REF2 or REF3, the refresh control unit 381 may enable the first refresh signal REF1 or may not enable the first refresh signal REF1. When the first refresh signal REF1 and the second or third refresh signal REF2 or REF3 are enabled together, the refresh command REF may be used to enable the first refresh signal REF1 and then enable the second or third refresh signal REF2 or REF3.

When enabling the second and third refresh signals REF2 and REF3 together, the refresh control unit 381 may enable the second refresh signal REF2, and then enable the third refresh signal REF3. For example, when M=4 and N=4, that is, when M and N have the same value, the refresh control unit 381 may sequentially enable the second refresh signal REF2 and the third refresh signal REF3 when the refresh command REF is inputted four times. Alternatively, the refresh control unit 381 may enable the second refresh signal REF2 and the third refresh signal REF3 such that the second and third refresh signals REF2 and REF3 do not overlap each other. For example, the refresh control unit 381 may count the refresh command REF from the beginning to determine the time at which the second refresh signal REF2 is enabled. Then, the refresh control unit 381 may count the refresh command REF after the refresh command REF is inputted two times, and determine the time at which the third refresh command REF3 is enabled. In this case, the second refresh signal REF2 may be enabled when the refresh command is inputted 4*X times, and the third refresh signal REF3 may be enabled when the refresh command is inputted (4*X+2) times, where X is a natural number.

The order in which the first to third refresh signals REF1 to REF3 are enabled may differ depending on circuit design.

Typically, two word lines are adjacent to a specific word line. When the specific word line is represented by 'WLK', the adjacent word lines may be represented by 'WLK−1' and 'WLK+1'. Thus, when the refresh command REF is inputted M times, the refresh control unit 381 may enable the second refresh signal REF2 two times. The target address generation unit 370 may generate an address corresponding to the word line WLK−1 when the second refresh signal REF2 is enabled for the first time, and generate an address corresponding to the word line WLK+1 when the second refresh signal REF2 is enabled for the second time. The order in which the addresses are generated may differ depending on circuit design.

The redundancy control unit 382 may store fault addresses. When the input address IN_ADD outputted from the address input unit 320 or the first counting information CNT_ADD1 is the same as the stored fault addresses, the redundancy control unit 382 may perform a redundancy operation to select a redundancy word line which replaces a word line corresponding to the input address IN_ADD or the first counting information CNT_ADD1. When the active command ACT is enabled, the redundancy control unit 382 may compare the input address IN_ADD to the stored fault addresses and generate redundancy information RED<0:B> corresponding to the redundancy word line replacing the word line corresponding to the input address IN_ADD. Furthermore, when the first refresh signal REF1 is enabled, the redundancy control unit 382 may compare the first counting information CNT_ADD1 to the stored fault addresses and generate redundancy information RED<0:B> corresponding to the redundancy word line replacing the word line corresponding to the first counting information CNT_ADD1. The redundancy control unit 382 may enable a redundancy signal RED_EN when the word line corresponding to the input address IN_ADD or the first counting information CNT_ADD1 is replaced. The redundancy control unit 382 will be described in detail with reference to FIG. 6.

The row control unit 383 may perform an active or refresh operation for a word line. The row control unit 383 may activate a word line corresponding to the input address IN_ADD when the active command ACT is enabled, and activate a redundancy word line corresponding to the redundancy information RED<0:B> when the redundancy signal RED_EN is enabled. The row control unit 383 may precharge the activated word line when the precharge command PRE is enabled.

The row control unit 383 may refresh a word line corresponding to the first counting information CNT_ADD1 when the first refresh signal REF1 is enabled, and refresh a redundancy word line corresponding to the redundancy information RED<0:B> when the redundancy signal RED_EN is enabled. The row control unit 383 may refresh a word line corresponding to the target address TAR_ADD when the second refresh signal REF2 is enabled. The row control unit 383 may refresh a redundancy word line corresponding to the second counting information CNT_ADD2 when the third refresh signal REF3 is enabled.

The memory may perform an additional refresh operation on word lines adjacent to a highly active word line and a redundancy word line, thereby preventing an error which occurs due to word line disturbance.

Figure 4:
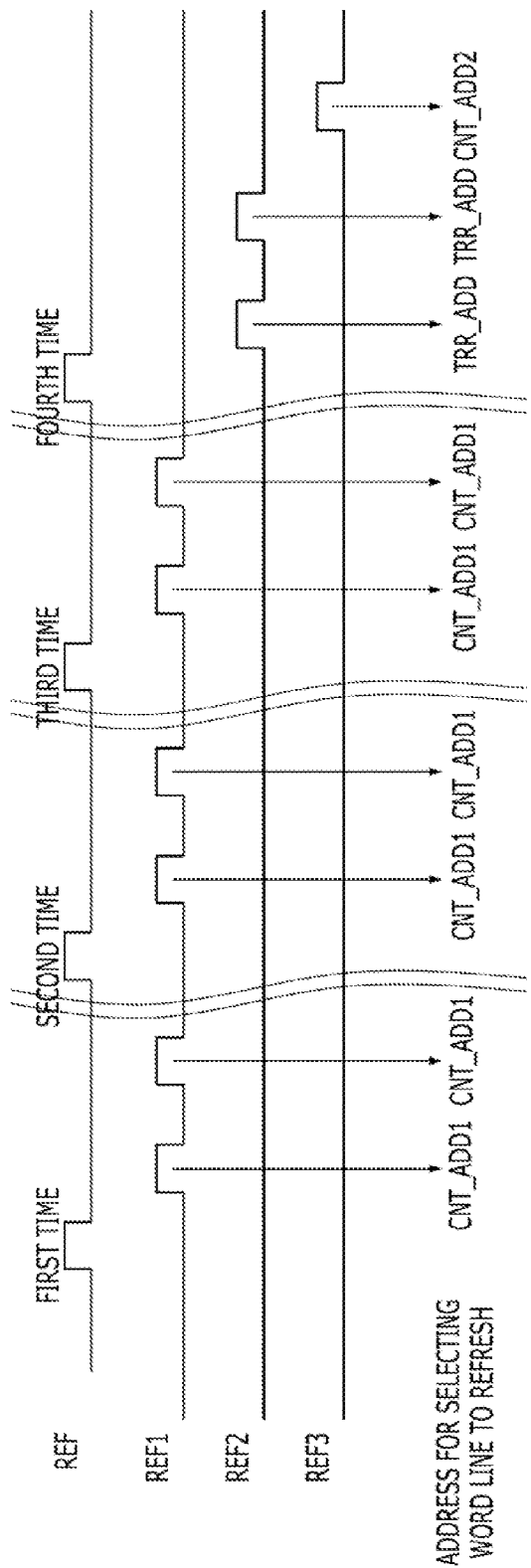
FIG. 4 is a waveform diagram for explaining a refresh operation of the memory of FIG. 3.

FIG. 4 is a waveform diagram for explaining the refresh operation of the memory of FIG. 3. FIG. 4 illustrates a case in which M and N are 4 (M=N=4) and the second and third refresh signals REF2 and REF3 are enabled together. The first refresh signal REF1 may be enabled two times whenever the refresh command REF is enabled, and may not be enabled when the refresh command REF is inputted a fourth time. The second refresh signal REF2 may be enabled two times whenever the refresh command REF is inputted four times, and the third refresh signal REF3 may be enabled one time whenever the refresh command REF is inputted four times.

First, when the refresh command REF is enabled for the first time, the first refresh signal REF1 may be enabled two times, and a word line corresponding to the first counting information CNT_ADD1 may be refreshed. At this time, when a K-th word line was refreshed in response to the first refresh signal REF1 enabled for the first time, a (K+1)-th word line may be refreshed in response to the first refresh signal REF1 enabled for the second time. Even when the refresh command REF is enabled for the second and third times, word lines may be sequentially refreshed in a similar manner to that described above.

When the refresh command REF is enabled for the fourth time, the second refresh signal REF2 may be enabled two times, and the third refresh signal REF3 may be enabled one time. When the highly active word line is an L-th word line, an (L−1)-th word line may be refreshed in response to the second refresh signal REF2 enabled for the first time, and an (L+1)-th word line may be refreshed in response to the second refresh signal REF2 enabled for the second time. When the third refresh signal REF3 is enabled, a redundancy word line corresponding to the second counting information CNT_ADD2 may be enabled.

Figure 5:
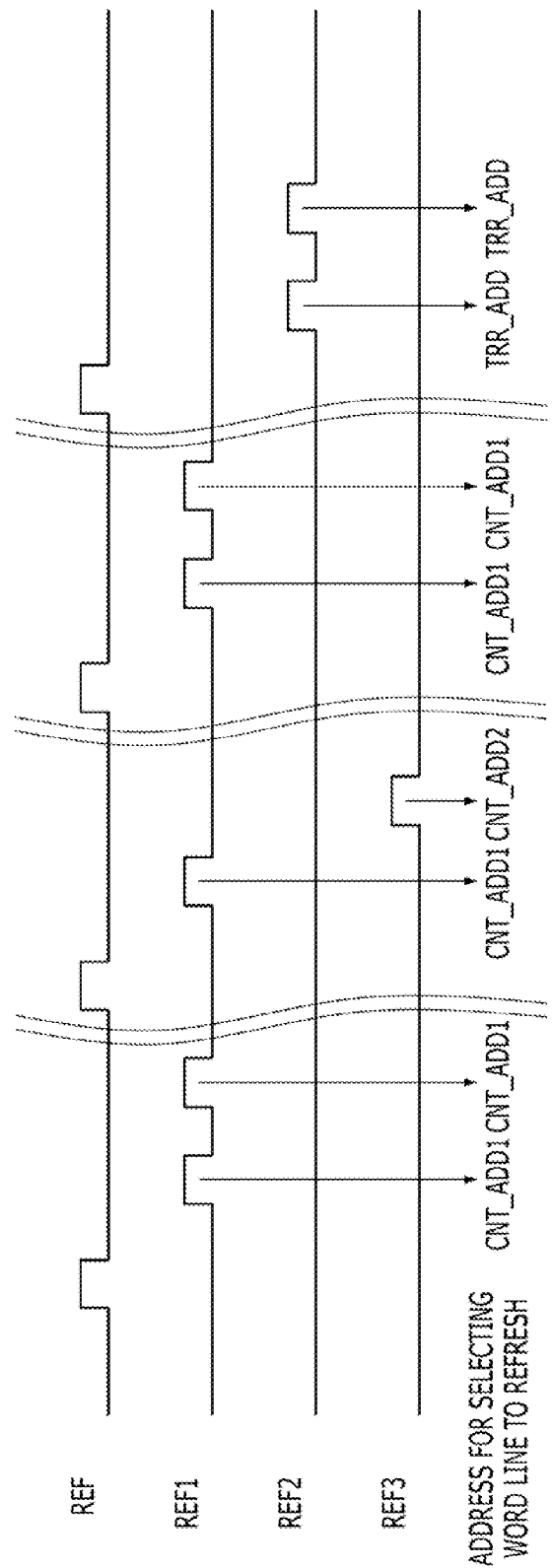
FIG. 5 is a waveform diagram for explaining the refresh operation of the memory of FIG. 3.

FIG. 5 is a waveform diagram for explaining the refresh operation of the memory of FIG. 3. FIG. 5 illustrates a case in which M and N are 4 (M=N=4), and the second and third refresh signals REF2 and REF3 are separately enabled. The first refresh signal REF1 may be enabled two times when the refresh command REF is inputted (2*X−1) times, where X is a natural number. In this case, the first refresh signal REF1 may not be enabled when the refresh command REF is inputted 4*X times, but enabled once when the refresh command REF is inputted (4*X−2) times. The second refresh signal REF2 may be enabled twice when the refresh command REF is inputted 4*X times, and the third refresh signal REF3 may be enabled once when the refresh command REF is inputted (4*X−2) times.

When the refresh command REF is enabled for the first time, the first refresh signal REF1 may be enabled two times, and a word line corresponding to the first counting information CNT_ADD may be refreshed. At this time, when a K-th word line was refreshed in response to the first refresh signal REF1 enabled for the first time, a (K+1)-th word line may be refreshed in response to the first refresh signal REF1 enabled for the second time. When the refresh command REF is enabled a third time, word lines may be sequentially refreshed in a similar manner to that described above.

When the refresh command REF is enabled twice, the first refresh signal REF1 may be enabled once, and the third refresh signal REF3 may be enabled once. At this time, a (K+2)-th word line may be refreshed in response to the first refresh signal REF1, and a first redundancy word line may be refreshed in response to the third refresh signal REF3.

When the refresh command REF is enabled for the fourth time, the second refresh signal REF2 may be enabled two times. When a highly active word line is an L-th word line, an (L−1)-th word line may be refreshed in response to the second refresh signal REF2 enabled for the first time, and an (L+1)-th word line may be refreshed in response to the second refresh signal REF2 enabled for the second time.

The order in which the word lines are refreshed by the memory, the order in which the memory performs one or more of the normal refresh operations, the target refresh operation, the redundancy refresh operation in response to the refresh command REF, and the number of refresh operations corresponding to one refresh command may be set in various manners by changing circuit design.

Figure 6:
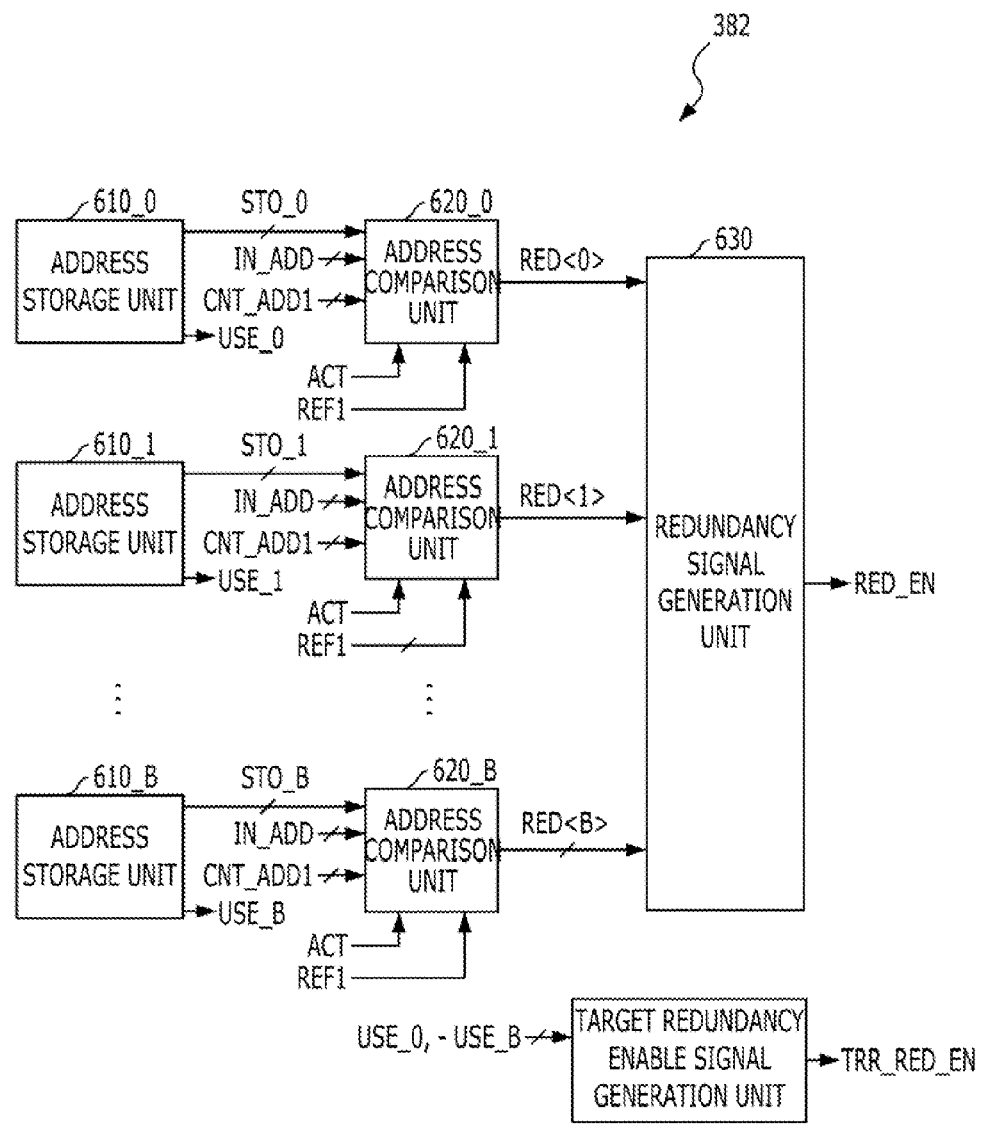
FIG. 6 is a configuration diagram of a redundancy control unit 382.

FIG. 6 is a configuration diagram of the redundancy control unit 382.

As Illustrated in FIG. 6, the row control unit 382 may include one or more address storage units 610_0 to 610_B, one or more address comparison units 620_0 to 620_B, a redundancy signal generation unit 630, and a target redundancy enable signal generation unit 640. The one or more address storage units 610_0 to 610_B may correspond to one or more redundancy word lines RWL0 to RWLB, respectively.

Referring to FIG. 6, the redundancy control unit 382 will be described.

The one or more address storage units 610_0 to 610_B may store a fault address detected through a test which was performed during a fabrication process of the memory or the like. The fault address may indicate a word line which cannot be used for some reason. The address storage units 610_0 to 610_B may output the stored values STO_0 to STO_B.

The one or more address comparison units 620_0 to 620_B may output results RED<0> to RED<B> obtained by comparing the input address IN_ADD to the outputs of the corresponding address storage units, respectively, when the active command ACT is enabled, and comparing the first counting information CNT_ADD1 to the outputs of the corresponding address storage units, respectively, when the first refresh signal REF1 is enabled. The outputs RED<0> to RED<B> of the address comparison units may correspond to the respective bits of the redundancy information RED<0:B>.

The address comparison units 620_0 to 620_B may enable the corresponding bits when the input address IN_ADD or the first counting information CNT_ADD1 is equal to the outputs of the corresponding address storage units. Thus, a redundancy word line corresponding to an enabled bit of the redundancy information RED<0:B> may replace the word line corresponding to the input address IN_ADD or the first counting information CNT_ADD1.

The redundancy signal generation unit 630 may generate the redundancy signal RED_EN indicating whether the word line corresponding to the input address IN_ADD or the first counting information CNT_ADD1 was replaced. When the redundancy signal RED_EN is enabled, it may indicate that the word line corresponding to the input address IN_ADD or the first counting information CNT_ADD1 was replaced, and when the redundancy signal RED_EN is not enabled, it may indicate that the word line corresponding to the input address IN_ADD or the first counting information CNT_ADD1 was not replaced. The redundancy signal generation unit 630 may disable the redundancy signal RED_EN when all the bits of the redundancy information RED<0:B> are disabled, and enable the redundancy signal RED_EN when one or more of the bits of the redundancy information RED<0:B> are enabled.

The target redundancy enable signal generation unit 640 may enable a target redundancy enable signal TRR_RED_EN when a set number of address storage units among the one or more address storage units 610_0 to 610_B store a fault address. The number of address storage units storing a fault address may be counted during the fabrication process of the memory, and then stored in the target redundancy enable signal generation unit 640, or may be counted in response to use signals USE_0 to USE_B outputted by the one or more address storage units 610_0 to 610_B. The one or more address storage units 610_0 to 610_B may enable the corresponding use signals when a fault address is stored therein. The target address enable signal 640 may enable the target redundancy enable signal TRR_RED_EN when a fault address is stored in more than half of the address storage units 610_0 to 610_B. The reason to generate the target redundancy enable signal TRR_RED_EN will be described below with reference to FIG. 7.

Figure 7:
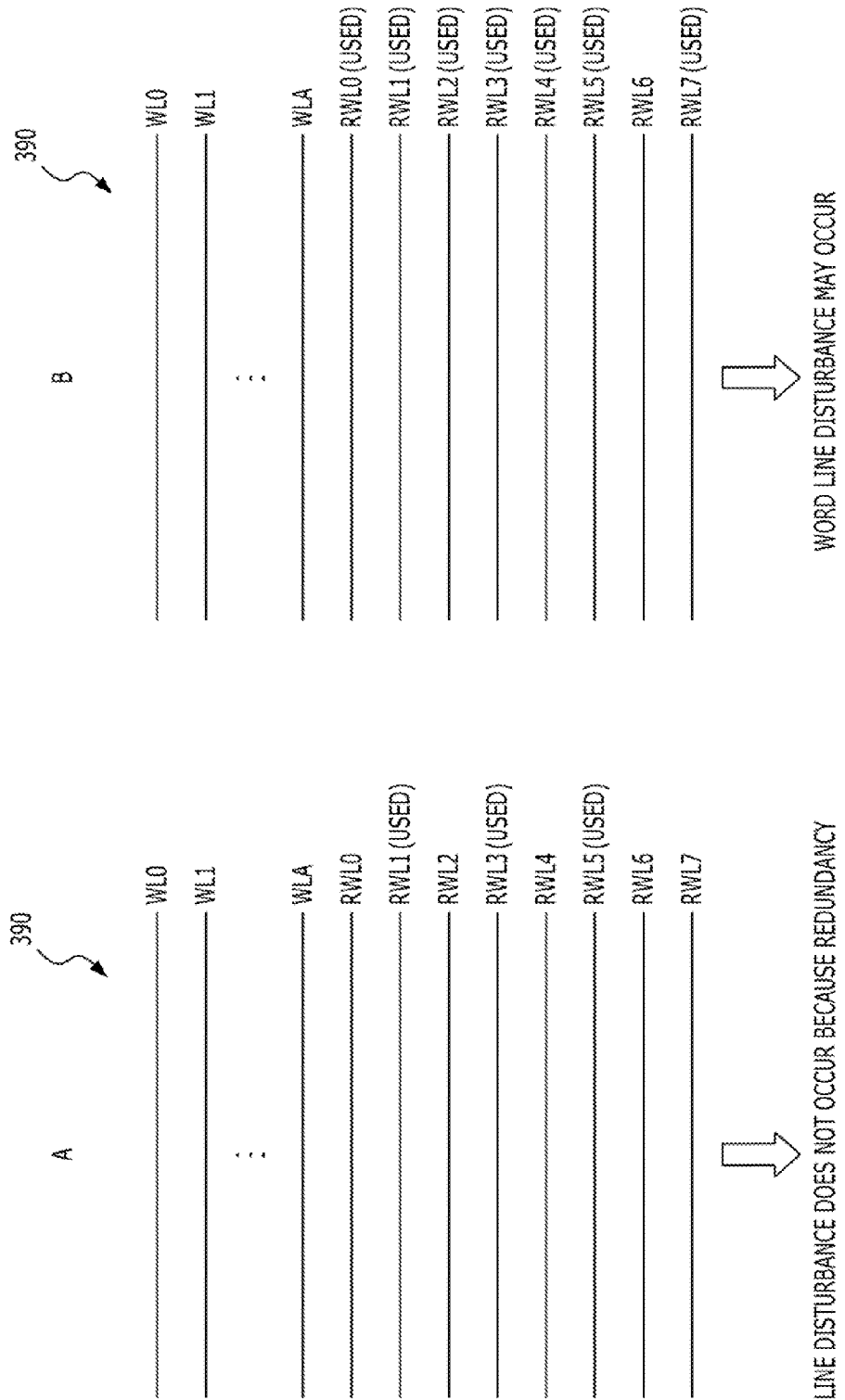
FIG. 7 is a diagram for explaining a memory in accordance with another embodiment of the present invention.

FIG. 7 is a diagram for explaining a memory in accordance with another embodiment of the present invention. FIG. 7 illustrates a part of the cell array 390. As illustrated in FIG. 7, the cell array 390 may include a plurality of word lines WL0 to WLA and one or more redundancy word lines RWL0 to RWL7. For a simpler description, the illustration of memory cells MC is omitted.

The memory of FIG. 3 may perform a refresh operation on a redundancy word line only when the target redundancy enable signal TRR_RED_EN is enabled. Thus, when generating the target redundancy enable signal TRR_RED_EN, the redundancy control unit 382 of FIG. 3 may enable the target redundancy enable signal TRR_RED_EN where a set number of redundancy word lines among the one or more redundancy word lines RWL0 to RWLB are used. The refresh control unit 381 may enable the third refresh signal REF3 whenever the refresh command REF is inputted N times, only when the target redundancy enable signal TRR_RED_EN is enabled.

The memory of FIG. 3 may use odd-numbered redundancy word lines RWL0, RWL2, ..., RWL6 first, and then use even-numbered redundancy word lines RWL1, RWL3, ..., RWL7. On the contrary, the memory of FIG. 3 may use the even-numbered redundancy word lines first, and then use the odd-numbered redundancy word lines. The following descriptions will be focused on a case in which the even-numbered redundancy word lines RWL1, RWL3, RWL5, and RWL7 in the cell array 390 are first used, and the odd-numbered redundancy word lines RWL0, RWL2, RWL4, and RWL6 are then used.

(1) When the Number of Used Redundancy Word Lines is Equal to or Less than Half (A)

For example, when the redundancy word lines RWL1, RWL3, and RWL5 were used among the even-numbered redundancy word lines, the redundancy word lines RWL0, RWL2, RWL4, and RWL6 adjacent to the redundancy word lines RWL1, RWL3, and RWL5 are not used. Thus, although the memory performs a large number of active operations, word line disturbance is unlikely to occur in the used redundancy word lines. Therefore, the redundancy word lines do not need to be refreshed separately. The target redundancy enable signal generation unit 640 may disable the target redundancy enable signal TRR_RED_EN.

(2) When the Number of Used Redundancy Word Lines is Greater than or Equal to Half (B)

For example, when all of the even-numbered redundancy word lines RWL1, RWL3, RWL5, and RWL7 were used and the redundancy word lines RWL0, RWL2, and RWL4 among the odd-numbered redundancy word lines were used, redundancy word lines adjacent to the redundancy word lines RWL0 to RWL7 are used. Thus, when the number of active operations for a specific redundancy word line increases, word line disturbance may occur in adjacent redundancy word lines. In this case, the redundancy word lines need to be refreshed. Thus, the target redundancy enable signal generation unit 640 may enable the target redundancy enable signal TRR_RED_EN.

However, whether redundancy word lines need to be refreshed may differ depending on the arrangement of the redundancy word lines or the use order of the redundancy word lines even when the same number of redundancy word lines is used. That is, the redundancy word lines may not refreshed even when more than half of the redundancy word lines are used. Thus, the condition in which the target redundancy enable signal generation unit 640 enables the target redundancy enable signal TRR_RED_EN may differ depending on circuit design.

The memory may perform an additional refresh operation on word lines adjacent to highly active word line and redundancy word lines, thereby preventing an error which occurs due to word line disturbance. In particular, the memory may additionally refresh a redundancy word line only when word line disturbance is likely to occur in the redundancy word line, thereby minimizing refresh current.

Figure 8:
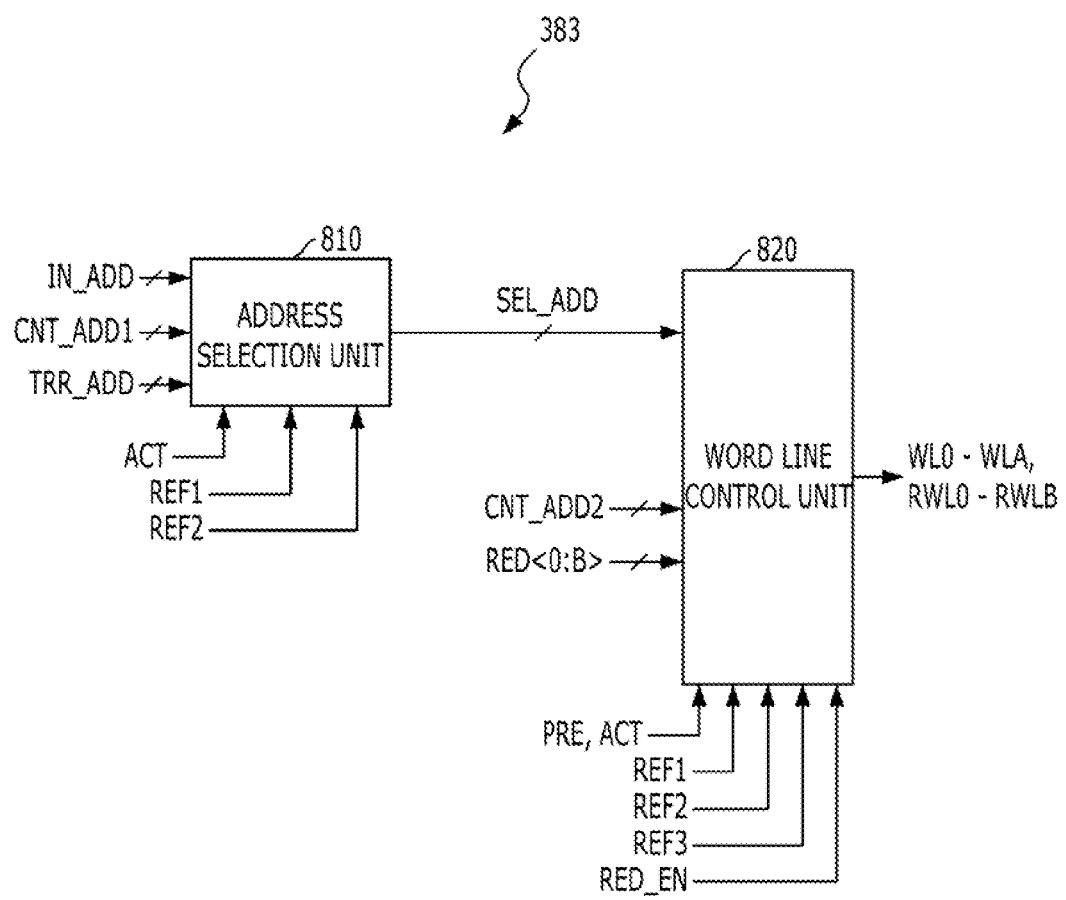
FIG. 8 is a configuration diagram of a row control unit 383.

FIG. 8 is a configuration diagram of the row control unit 383.

As Illustrated in FIG. 8, the row control unit 383 may include an address selection unit 810 and a word line control unit 820.

Referring to FIG. 8, the row control unit 383 will be described.

The address selection unit 810 may select an input address IN_ADD and output the selected address SEL_ADD when the active command ACT is enabled. When the first refresh command REF1 is enabled, the address selection unit 810 may select the first counting information CNT_ADD1 and output the selected address SEL_ADD, and when the second refresh command REF2 is enabled, the address selection unit 810 may select the target address TAR_ADD and output the selected address SEL_ADD.

The word line control unit 820 may activate a word line corresponding to the selected address SEL_ADD when the active command ACT is enabled, and activate a redundancy word line corresponding to the redundancy information RED<0:B> when the redundancy signal RED_EN is enabled. When the precharge command PRE is enabled, the word line control unit 820 may precharge the activated word line.

The word line control unit 820 may refresh a word line corresponding to the selected address SEL_ADD when the first refresh signal REF1 is enabled. In this case, when the redundancy signal RED_EN is enabled, the word line control unit 820 may refresh a redundancy word line corresponding to the redundancy information RED<0:B>. The word line control unit 820 may refresh a word line corresponding to the selected address SEL_ADD when the second refresh signal REF2 is enabled. The word line control unit 820 may refresh a redundancy word line corresponding to the second counting information CNT_ADD2 when the third refresh signal REF3 is enabled.

Figure 9:
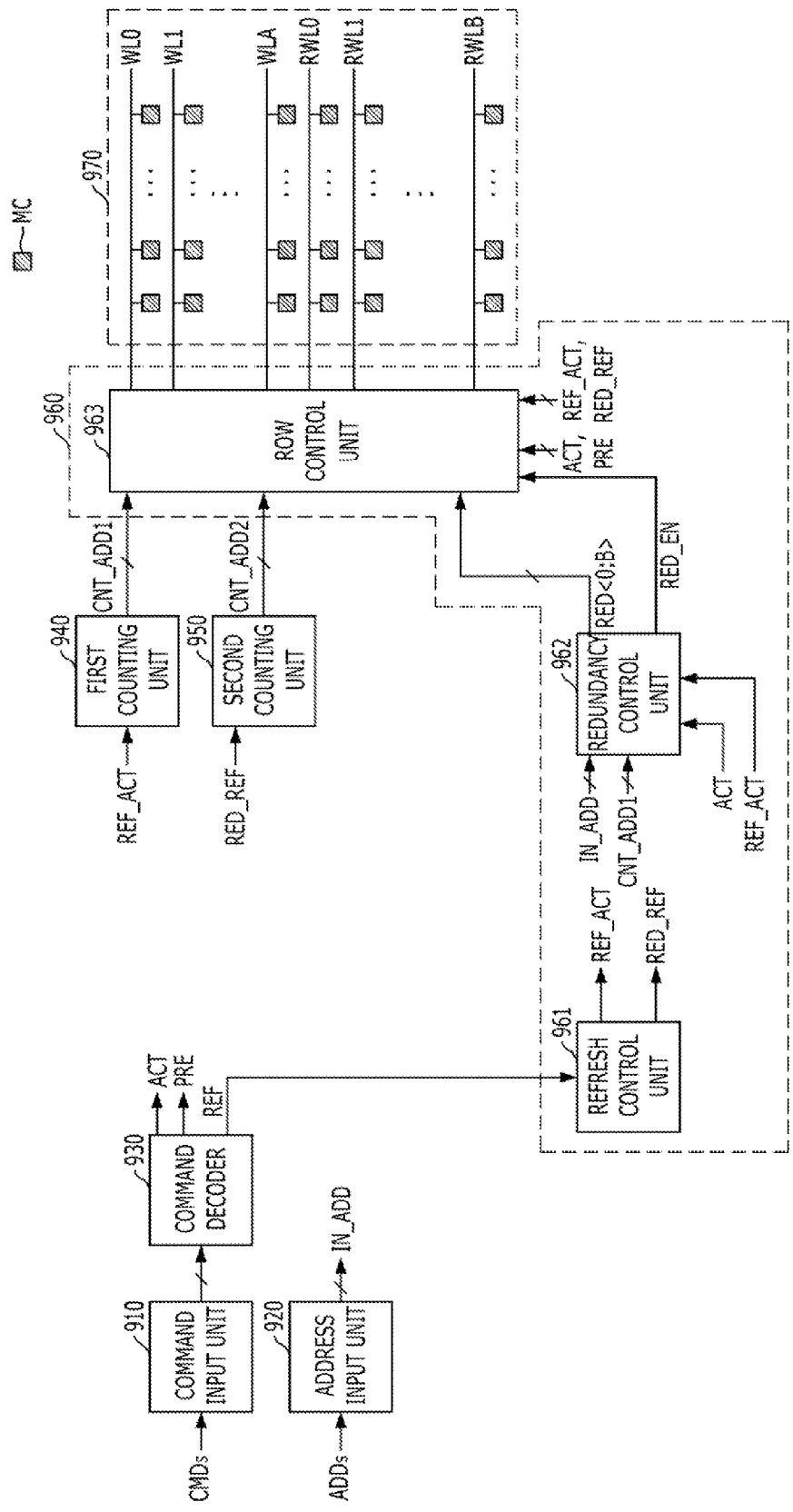
FIG. 9 is a configuration diagram of a memory in accordance with another embodiment of the present invention.

FIG. 9 is a configuration diagram of a memory in accordance with another embodiment of the present invention.

As illustrated in FIG. 9, the memory may include a command input unit 910, an address input unit 920, a command decoder 930, a first counting unit 940, a second counting unit 950, a control unit 960, and a cell array 970. FIG. 9 illustrates only components related to an active operation and a refresh operation in the memory, and does not illustrate components related to operations such as read and write operations, which have no direct relation with the present invention.

Referring to FIG. 9, the memory will be described.

Among the components of FIG. 9, the command input unit 910, the address input unit 920, the command decoder 930, and the cell array 970 may be configured in the same manner as the command input unit 310, the address input unit 320, the command decoder 330, and the cell array 390 of FIG. 3.

The first counting unit 940 may generate first counting information CNT_ADD1 of which the value is changed whenever word lines WL0 to WLA are refreshed. The first counting unit 940 may increase the value of the first counting information CNT_ADD1 by one whenever the refresh signal REF_ACT is enabled. The first counting information CNT_ADD1 may be used as an address for selecting a word line on which a refresh operation is to be performed during a normal refresh operation. When the first counting unit 910 increases the value of the counting information by one, it may indicate that the first counting unit 910 changes the counting information CNT_ADD1 such that a (K+1)-th word line WLK+1 is selected when a K-th word line WLK was previously selected.

The second counting unit 950 may generate second counting information CNT_ADD2 of which the value is changed whenever redundancy word lines RWL0 to RWLB are refreshed. The second counting unit 950 may increase the value of the second counting information CNT_ADD2 by one whenever a redundancy refresh signal RED_REF is enabled. The second counting information CNT_ADD2 may be used as information for selecting a redundancy word line on which a refresh operation is to be performed during a redundancy refresh operation. When the second counting unit 950 increases the value of the counting information CNT_ADD2 by one, it may indicate that the second counting unit 950 changes the counting information CNT_ADD2 such that a (K+1)-th redundancy word line RWLK+1 is selected when a K-th redundancy word line RWLK was previously selected.

The control unit 960 may refresh a word line selected through the first counting information CNT_ADD1 in response to a refresh command which is periodically inputted, and refresh a redundancy word line selected through the second counting information CNT_ADD2 when the refresh command REF is inputted N times. Since the first counting information CNT_ADD1 sequentially increases in response to the refresh signal REF_ACT, the control unit 960 may sequentially refresh the plurality of word lines WL0 to WLA in response to the first counting information CNT_ADD1. Furthermore, since the second counting information CNT_ADD2 sequentially increases in response to the redundancy refresh signal RED_REF, the control unit 960 may sequentially refresh the plurality of redundancy word lines RWL0 to RWLB in response to the second counting information CNT_ADD2.

The control unit 960 may include a refresh control unit 961, a redundancy control unit 962, and a row control unit 963. The refresh control unit 961 may enable the refresh signal REF_ACT in response to the refresh command REF, and enable the redundancy refresh signal RED_REF when the refresh command REF is inputted N times. The redundancy control unit 962 may be configured in the same manner as described with reference to FIGS. 3 and 6.

The row control unit 963 may perform an active or refresh operation for a word line. The row control unit 963 may activate a word line corresponding to the input address IN_ADD when the active command ACT is enabled. In this case, when the redundancy signal RED_EN is enabled, the row control unit 963 may activate a redundancy word line corresponding to redundancy information RED<0:B>. The row control unit 963 may precharge the activated word line when the precharge command PRE is enabled.

The row control unit 963 may refresh a word line corresponding to the first counting information CNT_ADD1 when the refresh signal REF_ACT is enabled, and refresh a redundancy word line corresponding to the redundancy information RED<0:B> when the redundancy signal RED_EN is enabled. The row control unit 963 may refresh a redundancy word line corresponding to the second counting information CNT_ADD2 when the redundancy refresh signal RED_REF is enabled.

The memory may enable the refresh signal REF_ACT to perform a normal refresh operation when the refresh command REF is inputted. In this case, whenever the refresh command REF is inputted N times, the memory may enable the redundancy refresh signal RED_REF to refresh a redundancy word line. The redundancy word line to be refreshed may be selected through the second counting information CNT_ADD2.

The memory may additionally refresh a redundancy word line, thereby preventing an error which occurs due to word line disturbance. In particular, since a redundancy word line is additionally refreshed only when word line disturbance is likely to occur in the redundancy word line, refresh current may be minimized.

Figure 10:
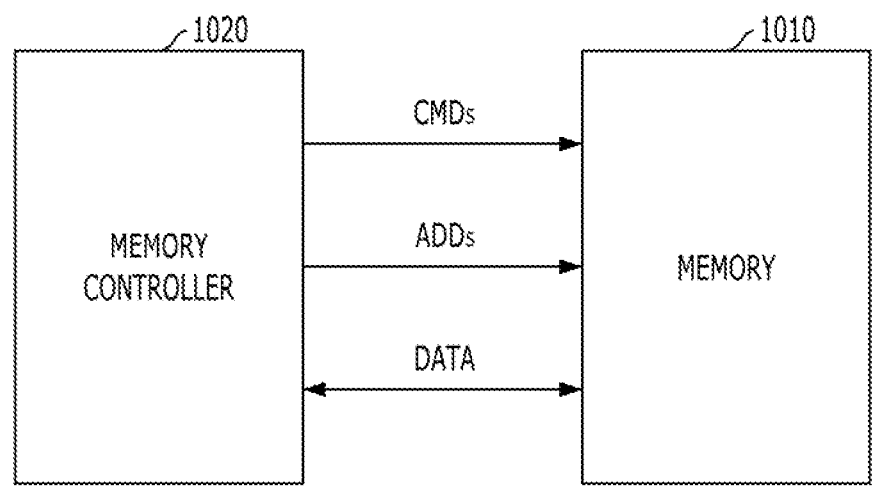
FIG. 10 is a configuration of a memory system in accordance with an embodiment of the present invention.

FIG. 10 is a configuration of a memory system in accordance with an embodiment of the present invention.

As illustrated in FIG. 10, the memory system may include a memory 1010 and a memory controller 1020.

The memory controller 1020 may apply commands CMDs and addresses ADDs to the memory 1010 to control the operation of the memory 1010, and exchange data DATA with the memory 1010 during a read or write operation. The memory controller 1020 may transmit commands CMDs to input an active command ACT, a precharge command PRE, or a refresh command REF to the memory 1010. The memory controller 1020 may transmit addresses ADDs for selecting a cell block and a word line to activate in the memory 1010, when inputting the active command ACT. The memory controller 1020 may periodically transmit the refresh command REF to the memory 1010.

The memory 1010 may include one of the memories described with reference to FIGS. 3, 7, and 9. The memory 1010 may detect an address of a highly active word line. The memory 1010 may detect and store an address of a highly active word line, and generate a target address during a target refresh operation. The memory 1010 may perform a normal refresh operation when the refresh command REF is inputted. In this case, the memory may perform a target refresh operation when the refresh command REF is inputted M times, and perform a redundancy refresh operation when the refresh command REF is inputted N times. For reference, the configuration and operation of the memory 1010 to perform the above-described refresh operations may be the same as those described with reference to FIGS. 3 to 9.

The memory system may perform an additional refresh operation on word lines adjacent to a highly active word line and redundancy word lines, thereby preventing an error which occurs due to word line disturbance.

In accordance with the embodiments of the present invention, the memory and the memory system may perform a target refresh operation on word lines adjacent to a highly active word line, thereby preventing the damage of data stored in memory cells coupled to such adjacent word lines.

Furthermore, the memory and the memory system may prevent the damage of data stored in memory cells coupled to a redundancy word line.

Although various embodiments have been described for illustrative purposes, it will be apparent to those skilled in the art that various changes and modifications may be made without departing from the spirit and scope of the invention as defined in the following claims.

What is claimed is:

1. A memory comprising:
   a plurality of word lines;
   one or more redundancy word lines suitable for replacing one or more word lines among the plurality of word lines;
   a target address generation unit suitable for generating one or more target addresses using a stored address; and
   a control unit suitable for sequentially refreshing the plurality of word lines in response to a refresh command which is periodically inputted, refreshing a word line selected based on the target address when the refresh command is inputted M times, and refreshing the one or more redundancy word lines whenever the refresh command is inputted N times, wherein the M and N are natural numbers.

2. The memory of claim 1, further comprising:
   an address detection unit suitable for detecting an address of a word line, which is activated a set number of times or more or is activated with a set frequency or higher, among the plurality of word lines,
   wherein the target address generation unit stores a detected address detected by the address detection unit as the stored address, and the one or more target addresses correspond to one or more word lines adjacent to a detected word line corresponding to the detected address.

3. The memory of claim 1, further comprising:
   a first counting unit suitable for generating first counting information which is changed whenever a word line is refreshed; and
   a second counting unit suitable for generating second counting information which is changed whenever a redundancy word line is refreshed.

4. The memory of claim 3, wherein the control unit refreshes a word line selected based on the first counting information in response to the refresh command, refreshes the word line selected based on the target address when the refresh command is inputted M times, and refreshes a redundancy word line selected based on the second counting information when the refresh command is inputted N times.

5. The memory of claim 4, wherein the control unit comprises:
   a refresh control unit suitable for enabling a first refresh signal in response to the refresh command, enabling a second refresh signal when the refresh command is inputted M times, and enabling a third refresh signal when the refresh command is inputted N times; and
   a row control unit suitable for refreshing the word line selected based on the first counting information in response to the first refresh signal, refreshing the word line selected based on the target address in response to the second refresh signal, and refreshing the redundancy word line selected based on the second counting information in response to the third refresh signal.

6. The memory of claim 5, wherein the first counting unit generates the first counting information by performing counting in response to the first refresh signal, and the second counting unit generates the second counting information by performing counting in response to the third refresh signal.

7. The memory of claim 5, wherein the control unit further comprises:
a redundancy control unit suitable for storing a fault address, and enabling a redundancy signal and outputting redundancy information corresponding to one of the one or more redundancy word lines when the first counting information is equal to the fault address,
wherein the row control unit comprises:
an address selection unit suitable for selecting the first counting information in response to the first refresh signal, and selecting the target address in response to the second refresh signal; and
a word line control unit suitable for refreshing a word line corresponding to an output of the address selection unit when the first refresh signal or the second refresh signal is enabled, refreshing a redundancy word line corresponding to the redundancy information when the redundancy signal is enabled, and refreshing a redundancy word line corresponding to the second counting information when the third refresh signal is enabled.

8. The memory of claim 7, wherein the redundancy control unit enables the redundancy signal and outputs the redundancy information in response to an active command, when an input address is equal to the fault address,
wherein the word line control unit activates a word line corresponding to the input address in response to the active command and activates a redundancy word line corresponding to the redundancy information in response to the redundancy signal.

9. The memory of claim 4, wherein when a set number or more of redundancy word lines are used among the one or more redundancy word lines, the control unit refreshes the redundancy word line selected based on the second counting information when the refresh command is inputted N times.

10. The memory of claim 9, wherein the control unit comprises:
a redundancy control unit suitable for storing fault addresses, enabling a redundancy signal and outputting redundancy information corresponding to one of the redundancy word lines when the first counting information is equal to one of stored fault addresses, and enabling a target redundancy enable signal when the number of the stored fault addresses is a set number or more;
a refresh control unit suitable for enabling a first refresh signal in response to the refresh command, enabling a second refresh signal when the refresh command is inputted M times, and enabling a third refresh signal in response to the target redundancy enable signal when the refresh command is inputted N times; and
a row control unit suitable for refreshing the word line selected based on the first counting information in response to the first refresh signal, refreshing the word line selected based on the target address in response to the second refresh signal, and refreshing the redundancy word line selected based on the second counting information in response to the third refresh signal.

11. The memory of claim 10, wherein the redundancy control unit comprises:
one or more address storage units suitable for storing the fault addresses and generating use signals when storing the fault addresses;
one or more address comparison units suitable for comparing the stored fault addresses and the first counting information to output the redundancy information;
a redundancy signal generation unit suitable for generating the redundancy signal in response to the redundancy information; and
a target redundancy enable signal generation unit suitable for generating the target redundancy enable signal in response to the use signals.

12. The memory of claim 10, wherein the redundancy control unit comprises:
first address storing units corresponding to arranged at odd-number-th positions redundancy word lines; and
second address storing units corresponding to arranged at even-number-th positions redundancy word lines,
wherein the redundancy control unit enables the target redundancy enable signal, when all of first address storing units store the fault addresses in case where the first address storing units being used first among the first address storing units and the second address storing units,
wherein the redundancy control unit enables the target redundancy enable signal, when all of second address storing units store the fault addresses in case where the second address storing units being used first among the first address storing units and the second address storing units, and
wherein a fault address is stored in the second address storing unit after all of the first address storing units store the fault addresses.

13. A memory system comprising:
a memory comprising a plurality of word lines and one or more redundancy word lines for replacing one or more word lines among the plurality of word lines, and suitable for sequentially refreshing the plurality of word lines in response to a refresh command which is periodically inputted, refreshing a word line selected based on a target address whenever the refresh command is inputted M times, and sequentially refreshing the one or more redundancy word lines whenever the refresh command is inputted N times, wherein the N and M are natural numbers; and
a memory controller suitable for periodically inputting the refresh command to the memory,
wherein the target address corresponds to one or more word lines adjacent to a word line which is activated a set number of times or more or is activated with a set frequency or more, among the plurality of word lines.

14. The memory system of claim 13, wherein the memory comprises:
an address detection unit suitable for detecting an address of a word line, which is activated a set number of times or more or is activated with a set frequency or more, among the plurality of word lines, and generating the target address corresponding to one or more word lines adjacent to a detected word line corresponding to the address detected by the address detection unit.

15. The memory system of claim 13, wherein the memory generates first counting information which is changed whenever a word line is refreshed, and generates second counting information which is changed whenever a redundancy word line is refreshed, and
the memory refreshes a word line selected based on the first counting information in response to the refresh command, refreshes a word line selected based on the target address when the refresh command is inputted M times, and refreshes a redundancy word line selected based on the second counting information when the refresh command is inputted N times.

16. The memory system of claim 13, wherein when a set number or more of redundancy word lines are used among the one or more redundancy word lines, the memory sequentially refreshes the one or more redundancy word lines whenever the refresh command is inputted N times.

17. A memory comprising:
a plurality of word lines;
one or more redundancy word lines suitable for replacing one or more word lines among the plurality of word lines;
a first counting unit suitable for generating first counting information which is changed whenever a word line is refreshed; and
a second counting unit suitable for generating second counting information which is changed whenever a redundancy word line is refreshed; and
a control unit suitable for refreshing a word line selected based on the first counting information in response to the refresh command which is periodically inputted, and refreshing a redundancy word line selected based on the second counting information whenever the refresh command is inputted N times, wherein the N is a natural number.

18. The memory of claim 17, wherein the control unit refreshes a word line selected based on the first counting information in response to the refresh command, and refreshes a redundancy word line selected based on the second counting information when the refresh command is inputted N times.

19. The memory of claim 17, wherein the control unit comprises:
a redundancy control unit suitable for enabling a redundancy signal when the first counting information is equal to a fault address;
a refresh control unit suitable for enabling a refresh signal in response to the refresh command, and enabling a redundancy refresh signal when the refresh command is inputted N times; and
a row control unit suitable for refreshing a word line selected based on the first counting information in response to the refresh signal, and refreshing a redundancy word line selected based on the second counting information in response to the redundancy refresh signal.

20. The memory of claim 19, wherein the first counting unit generates the first counting information by performing counting in response to the refresh signal, and
the second counting unit generates the second counting information by performing counting in response to the redundancy refresh signal.

21. A memory comprising:
a plurality of word lines;
one or more redundancy word lines suitable for replacing one or more word lines among the plurality of word lines;
a counting unit suitable for generating first counting information which is changed whenever a word line is refreshed, and generating second counting information which is changed whenever a redundancy word line is changed;
a target address generation unit suitable for detecting an address of a word line, which is activated a set number of times or more or is activated with a set frequency or higher, among the plurality of word lines, and generating a target address corresponding to one or more word lines adjacent to a detected word line corresponding to a detected address detected by the address detection unit; and
a control unit suitable for refreshing a word line selected based on the first counting information in response to a refresh command, refreshing a word line selected based on the target address whenever the refresh command is inputted M times, and refreshing a redundancy word line selected based on the second counting information whenever the refresh command is inputted N times, wherein the M and N are natural numbers.

22. The memory of claim 21, wherein the control unit comprises:
a refresh control unit suitable for enabling a first refresh signal in response to the refresh command, enabling a second refresh signal when the refresh command is inputted M times, and enabling a third refresh signal when the refresh command is inputted N times; and
a row control unit suitable for refreshing the word line selected based on the first counting information in response to the first refresh signal, refreshing the word line selected based on the target address in response to the second refresh signal, and refreshing the redundancy word line selected based on the second counting information in response to the third refresh signal.

23. The memory of claim 21, wherein the counting unit generates the first counting information by performing counting in response to the first refresh signal, and generates the second counting information by performing counting in response to the third refresh signal.

24. The memory of claim 1, further comprising:
one or more address storage units corresponding to the one or more redundancy word lines,
wherein the control unit sequentially refreshes the one or more redundancy word lines whenever the refresh command is inputted N times where a set number or more of address storage units among the one or more fail address storage units store a fault address.

* * * * *